(12) United States Patent
Wang et al.

(10) Patent No.: US 7,737,635 B2
(45) Date of Patent: *Jun. 15, 2010

(54) HIGH EFFICIENCY WHITE LIGHT EMITTING DIODE AND METHOD FOR MANUFACTURING THE SAME

(75) Inventors: Bily Wang, Hsin Chu (TW); Jonnie Chuang, Pan Chiao (TW); Chao-Yuan Huang, Tai Chung (TW)

(73) Assignee: Harvatek Corporation, Hsin Chu (TW)

( * ) Notice: Subject to any disclaimer, the term of this patent is extended or adjusted under 35 U.S.C. 154(b) by 506 days.

This patent is subject to a terminal disclaimer.

(21) Appl. No.: 11/702,496

(22) Filed: Feb. 6, 2007

(65) Prior Publication Data

US 2007/0132359 A1   Jun. 14, 2007

(51) Int. Cl.
*H01J 1/62* (2006.01)

(52) U.S. Cl. ..................................................... 313/512
(58) Field of Classification Search .......... 313/485–512
See application file for complete search history.

(56) References Cited

U.S. PATENT DOCUMENTS

| | | | | |
|---|---|---|---|---|
| 5,683,823 | A * | 11/1997 | Shi et al. ................ | 428/690 |
| 2002/0105266 | A1* | 8/2002 | Juestel et al. ............. | 313/512 |
| 2003/0214233 | A1* | 11/2003 | Takahashi et al. ......... | 313/512 |

* cited by examiner

*Primary Examiner*—Joseph L Williams
(74) *Attorney, Agent, or Firm*—Rosenberg, Klein & Lee

(57) ABSTRACT

A light source module of a white light emitting diode comprising a blue LED, a packaging substrate, wherein the blue LED is mounted on and electrically connected to the packaging substrate, a cap layer, enclosing the blue LED, wherein the cap layer includes a mixture of silicon and phosphor blend at ratio of 1:0.2-0.5, and a protective layer over the cap layer.

6 Claims, 6 Drawing Sheets

HIGH EFFICIENCY WHITE LIGHT EMITTING DIODE AND METHOD FOR MANUFACTURING THE SAME

FIELD OF THE INVENTION

The present invention relates to a white light emitting diode light source and a method for manufacturing the same, and especially to a white light emitting diode light source with a satisfactory color rendering property and high lighting efficiency, and a method for manufacturing the same.

BACKGROUND OF THE INVENTION

Compact white light sources are extensively used for backlight modules of scanners or color panel displays. Therefore, the improvement of white light sources is also great issue for the related industries.

FIG. 1 shows an exploded view of an edge backlight module 10, which comprises a panel light guide 100, a lamp 102 on one side of the panel light guide 100, a lamp reflecting plate 104 on outer side of the lamp 102, and a reflecting plate 106 on bottom of the panel light guide 100. The edge backlight module 10 further comprises prism and light diffusing plates (not shown). The edge backlight module 10 can be used for a panel display and the lamp 102 can be a CCFL for emitting white light. The light emitted from the lamp 102 is reflected by the lamp reflecting plate 104 and then guided by the panel light guide 100, the prism and the light diffusing plate for forward emission. The forward emission can provide backlight for an LCD device.

However, the CCFL has the following problems: (1) complicated circuit design due to a high driving voltage; (2) unstable illumination that varies with the temperature; and (3) a dead zone present at both end of the lamp. When the edge backlight module 10 is used for a scanner, the scanning quality is degraded due to the suboptimal conditions mentioned above.

The rapid progress in LED technologies increases the possibility of replacing the CCFL with an LED, and the white LED can be provided by in the following two ways:

(1) When a blue LED is used with yellow phosphor, the illumination efficiency thereof is influenced by the phosphor.

(2) When red, green and blue LEDs are used together to mix a white light, the color temperature of this white LED may be unstable due to process variation of the LEDS.

SUMMARY OF THE INVENTION

It is an object of the present invention to provide a light source module of a white light emitting diode light source with a satisfactory color rendering property and high lighting efficiency.

In order to achieve the above and other objectives, the light source module of the white light emitting diode according to the present invention includes a blue LED; a packaging substrate, wherein the blue LED is mounted on and electrically connected to the packaging substrate; a cap layer, enclosing the blue LED, wherein the cap layer includes a mixture of silicon and phosphor blend at ratio of 1:0.2-0.5, and a protective layer over the cap layer.

The above summaries are intended to illustrate exemplary embodiments of the invention, which will be best understood in conjunction with the detailed description to follow, and are not intended to limit the scope of the appended claims.

BRIEF DESCRIPTION OF DRAWINGS

The features of the invention believed to be novel are set forth with particularity in the appended claims. The invention itself however may be best understood by reference to the following detailed description of the invention, which describes certain exemplary embodiments of the invention, taken in conjunction with the accompanying drawings, in which:

DETAILED DESCRIPTION OF THE INVENTION

Figure 1:
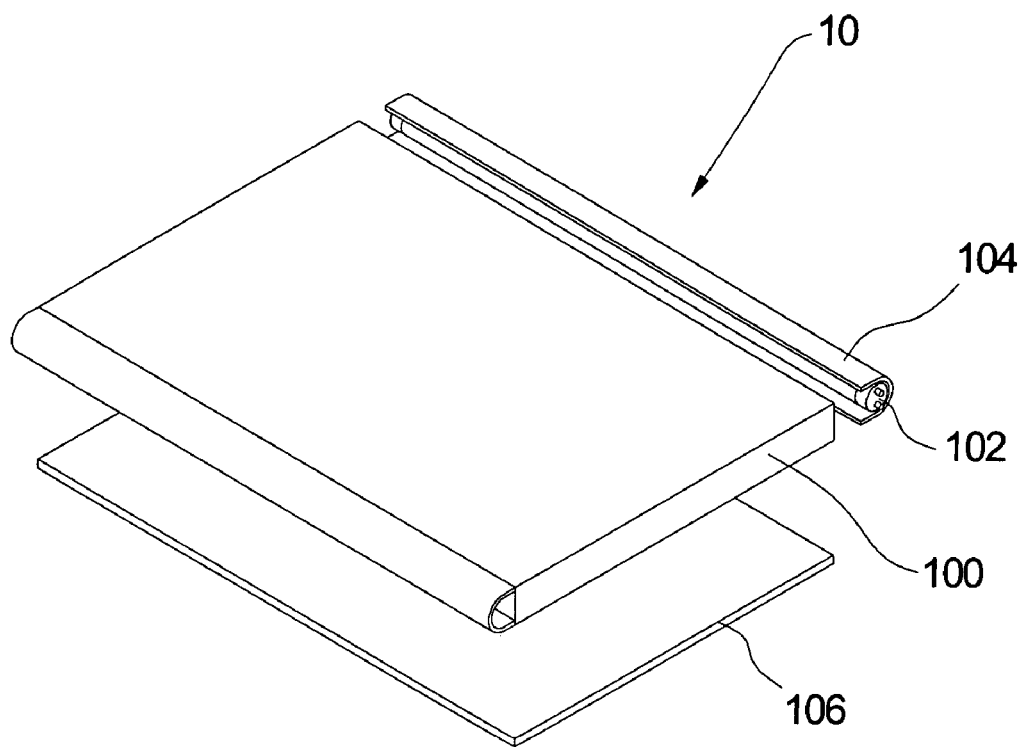
FIG. 1 shows an exploded view of a conventional edge backlight module.
Figure 2:
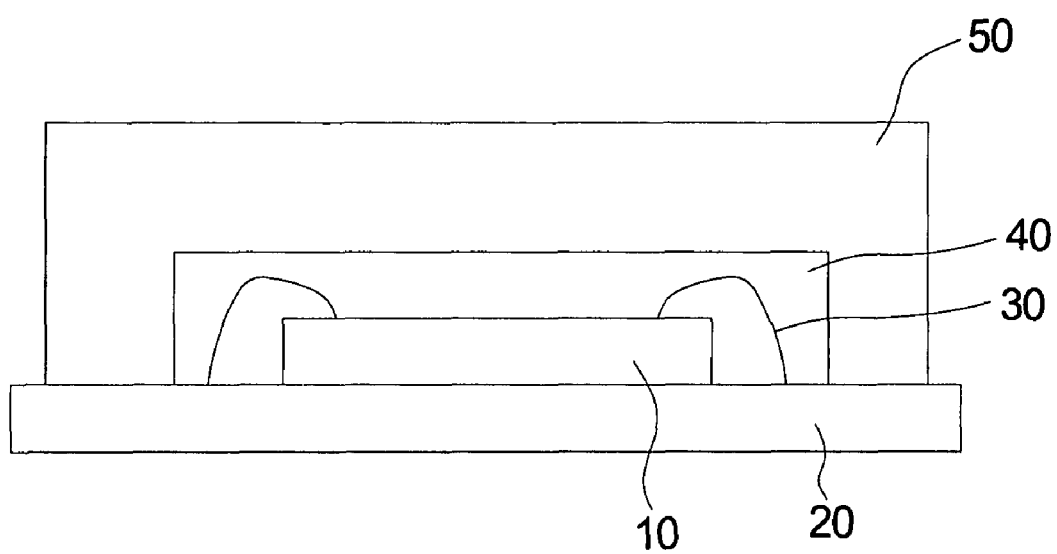
FIG. 2 shows a schematic view of a light source module of a white light emitting diode according to one embodiment of the invention.

FIG. 2 shows a schematic view of a light source module of a white light emitting diode according to one embodiment of the invention. The light source module as shown includes a blue LED 10, a packaging substrate 20 on which the blue LED 10 is electrically mounted on, wires 30 bonded the blue LED 10 to the packaging substrate 20, a cap layer 40 enclosing the wires 30 and the blue LED 10, and a protective layer 50 over the cap layer 40.

The blue LED 10 emits light of wavelength in range of 300-550 nm. The material of packaging substrate 20 and wire bonding for wires 30 are well known in the art, and therefore they can be omitted herebelow. The cap layer 40 includes a mixture of silicon and phosphor blend at ratio of 1:0.2-0.5. The phosphor blend is made on at least one selected from the group consisting of a red phosphor PR, a green phosphor PG and a yellow phosphor PY, depending on the field to apply. Optionally, a brightener can be added into the cap layer. The brightener can be any kind of conventional optical brightener as long as it is a dye that absorbs light in the ultraviolet and violet region of spectrum and re-emit light in the blue region. The protective layer 50 is made of insulative material such as epoxy resin or silicon that can protect the blue LED and the cap layer 40 from being damaged or deteriorated.

The blue LED emits blue light after being driven by suitable electrical current. The red phosphor PR, the green phosphor PG and the yellow phosphor PY will emit red light, green light and yellow light, respectively, after absorbing the blue light, to mix and form a white light.

The blue LED can be in a surface mount package, lamp-type or chip on board (COB)-type packaging.

In the present invention, the red phosphor PR can be, but is not limited to, CaS:Eu or SrS:Eu; the yellow phosphor PY can be, but is not limited to, YAG:Ce or TbAG:Ce; and the green phosphor PG can be, but is not limited to, $SrGa_2S_4$:Eu or $Ca_8EuMnMg(SiO_4)_4C_{12}$. It should be noted the present invention can use other phosphor material excitable by blue light with a wavelength of 300-550 nm.

Moreover, in above preferred embodiment, the phosphor blend of red phosphor PR and the green phosphor PG generates a white light of more satisfactory color temperature.

Figure 3:
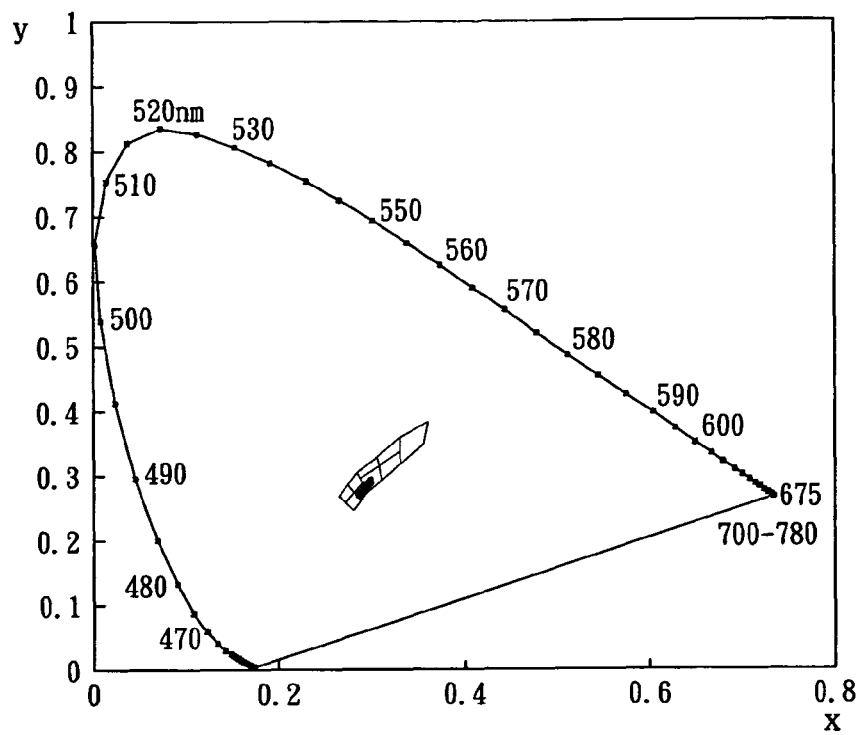
FIG. 3 shows an emission efficiency of the light source module according to the first example of the invention.

In first example of the invention, the light source module of the white light emitting diode includes a blue LED, a substrate which the blue LED is mounted on and electrically connected to by wires, a cap layer and a protective layer assembled in the above manner. The cap layer used in the light source module of the white light emitting diode includes 1 g of silicon and 0.35 g phosphor blend of red phosphor, green phosphor and yellow phosphor. The protective layer is made of epoxy. FIG. 3 is an emission efficiency of the light source module according to the first example of the invention. It shows that the color of light emitted is substantially pure white so that it can be applied to a back light source of display device such as cellphone.

Figure 4:
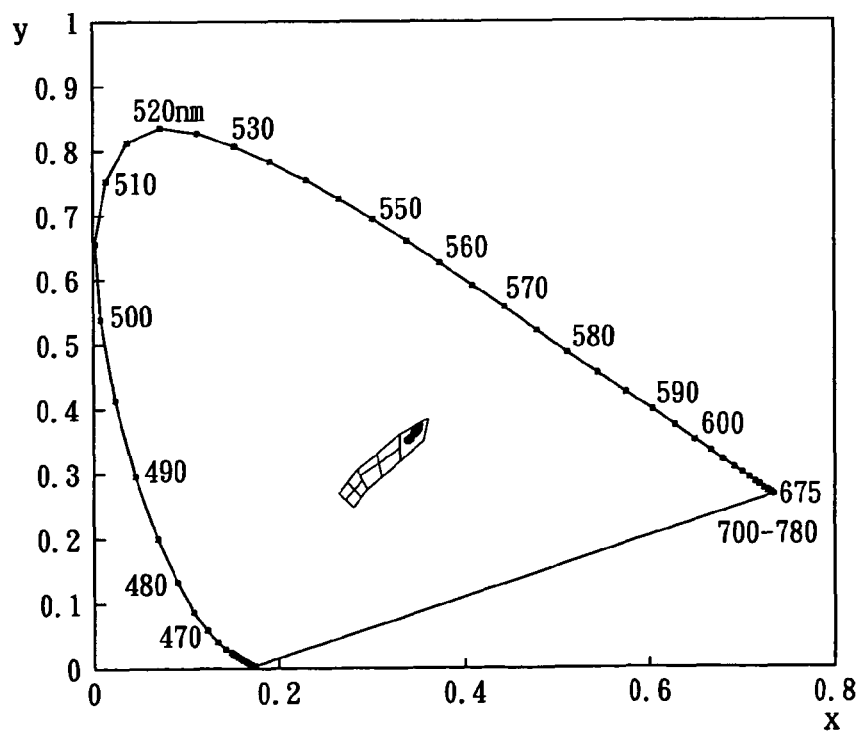
FIG. 4 shows an emission efficiency of the light source module according to the second example of the invention.

In a second example of the invention, the light source module of the white light emitting diode includes a blue LED, a substrate which the blue LED is mounted on and electrically connected to by wires, a cap layer and a protective layer assembled in the above manner. The cap layer used in the light source module of the white light emitting diode includes 1 g of silicon and 0.45 g phosphor blend of red phosphor, green phosphor and yellow phosphor. The protective layer is made of epoxy. FIG. 4 is an emission efficiency of the light source module according to the first example of the invention. It shows that the color of light emitted is substantially yellowish so that it can be applied to a light source for illumination, such as a halogen light.

Figure 5:
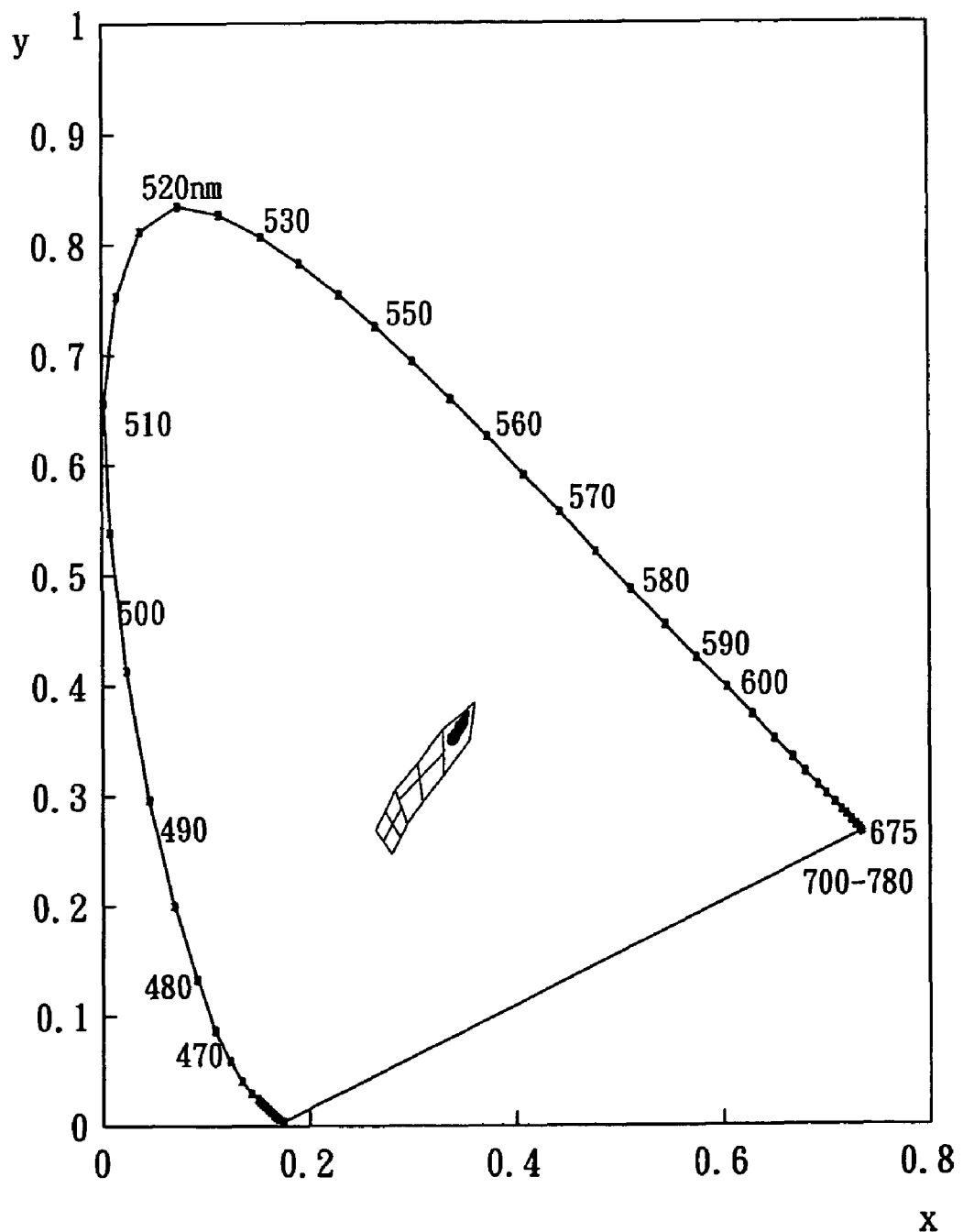
FIG. 5 shows an emission efficiency of the light source module according to the third example of the invention.

In a third example of the invention, the light source module of the white light emitting diode includes a blue LED, a substrate which the blue LED is mounted on and electrically connected to by wires, a cap layer and a protective layer assembled in the above manner. The cap layer used in the light source module of the white light emitting diode includes 1 g of silicon, 0.5 g of phosphor blend of red phosphor, green phosphor and yellow phosphor, and 0.1 g of brightener. The protective layer is made of epoxy. FIG. 5 is an emission efficiency of the light source module according to the first example of the invention. It shows that the color of light emitted is substantially yellowish so that it can be applied to a light source for illumination, such as a halogen light.

Figure 6:
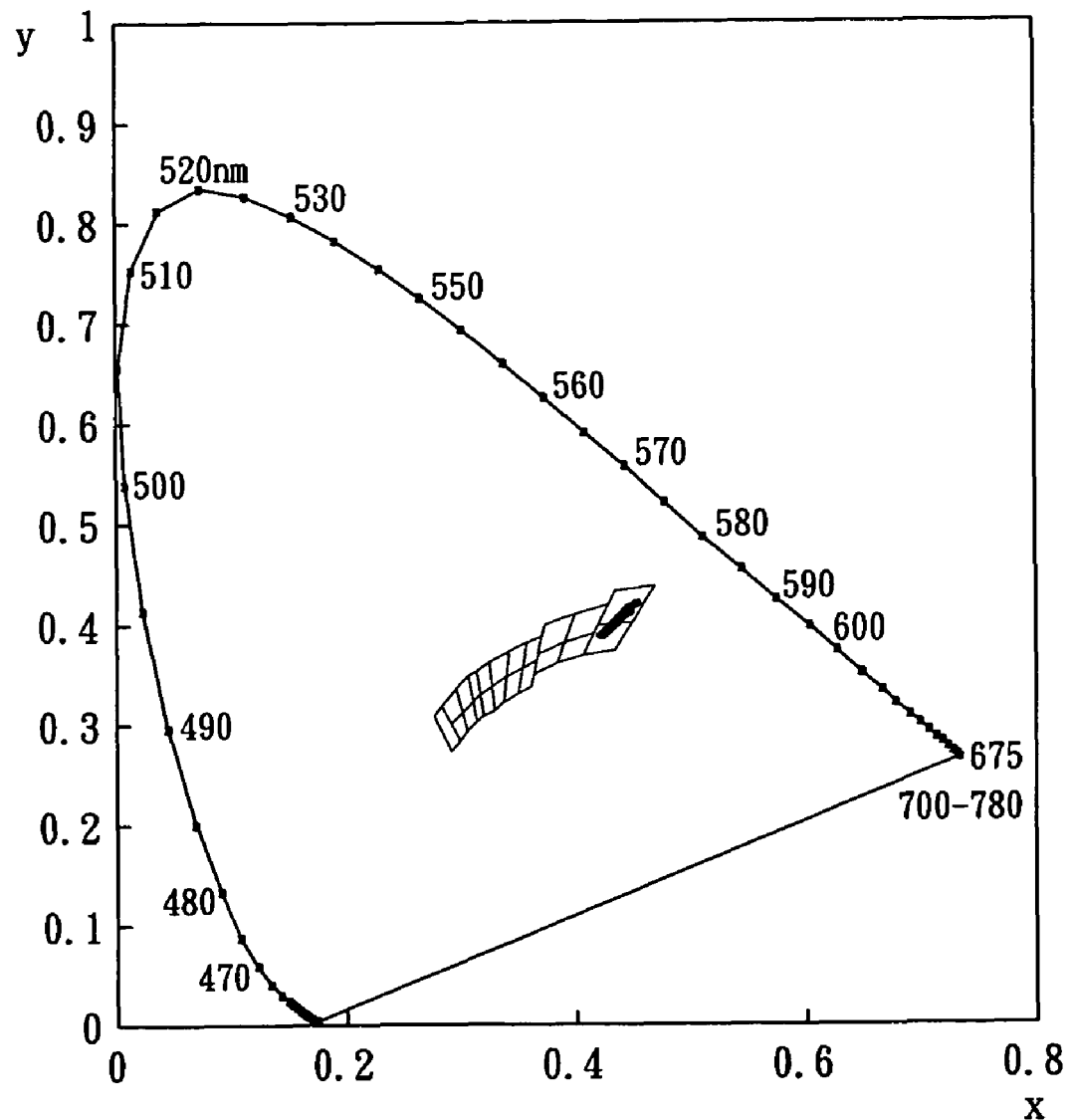
FIG. 6 shows an emission efficiency of the light source module according to the forth example of the invention.
Figure 7:
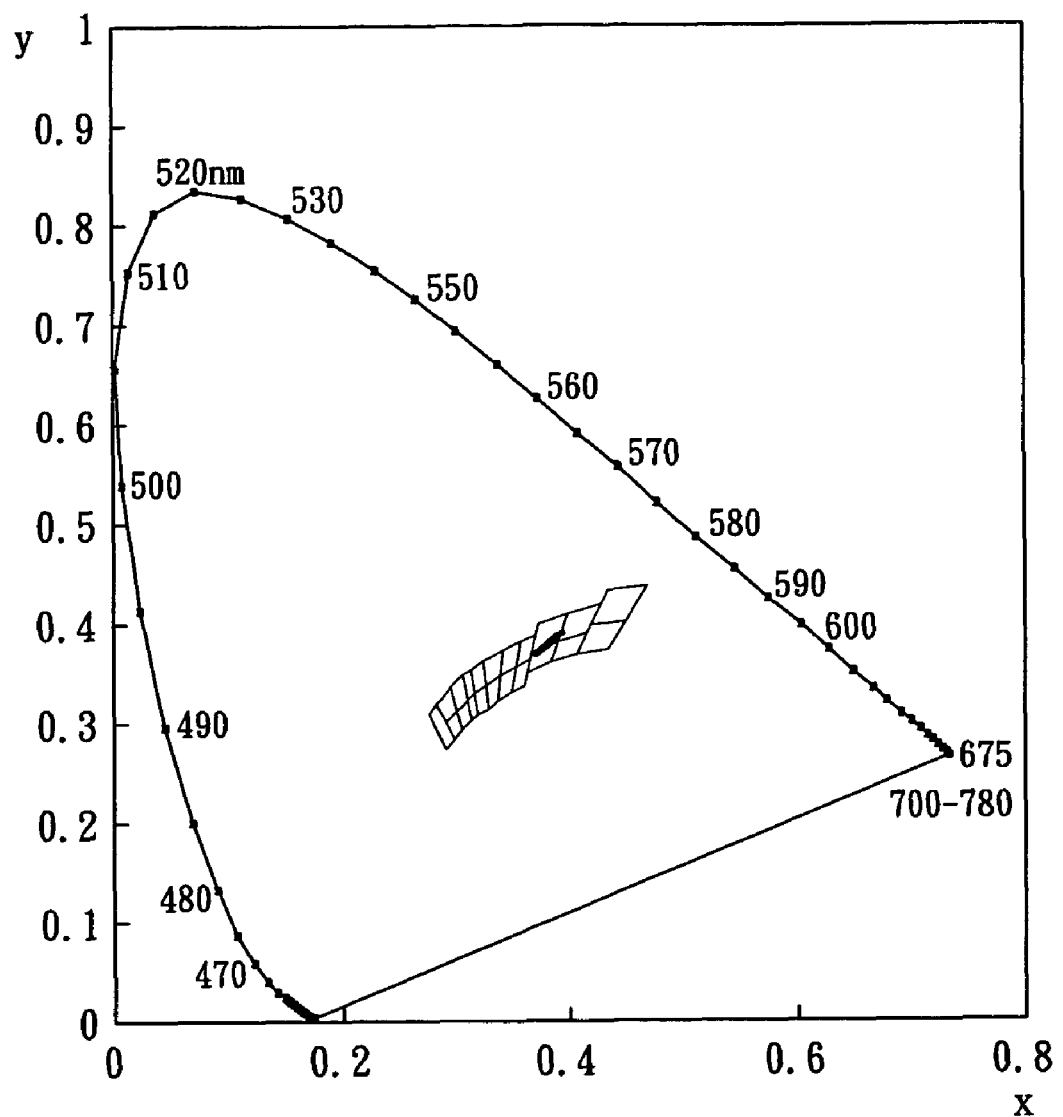
FIG. 7 shows an emission efficiency of the light source module according to the fifth example of the invention.

In a fourth example of the invention, the light source module of the white light emitting diode includes a blue LED, a substrate which the blue LED is mounted on and electrically connected to by wires, a cap layer and a protective layer assembled in the above manner. The cap layer used in the light source module of the white light emitting diode includes 1 g of silicon, 0.3 g phosphor blend of red phosphor, green phosphor and yellow phosphor, and 0.3 g brightener. The protective layer is made of epoxy. FIG. 6 is an emission efficiency of the light source module according to the first example of the invention. It shows that the color of light emitted is substantially yellowish so that it can be applied to a wall lighting with warm color.

In a fifth example of the invention, the light source module of the white light emitting diode includes a blue LED, a substrate which the blue LED is mounted on and electrically connected to by wires, a cap layer and a protective layer assembled in the above manner. The cap layer used in the light source module of the white light emitting diode includes 1 g of silicon, 0.35 g phosphor blend of red phosphor, green phosphor and yellow phosphor, and 0.5 g brightener. The protective layer is made of epoxy. FIG. 6 is an emission efficiency of the light source module according to the first example of the invention. It shows that the color of light emitted is substantially yellowish so that it can be applied to a wall lighting with warm color.

In comparison with the prior art white light source, the light source module of the white light emitting diode according to the present invention has a better color rendering property because the white light emitting diode light source has a broader spectrum.

More particularly, the conventional light source module of the white light source has a poor color rendering property because it only has a blue LED and yellow phosphor. The light source module of the white light emitting diode light source according to the present invention has a better color rendering property because it also covers the red and green spectra. The color temperature of the light source module of the white light emitting diode light source according to the present invention can be flexibly adjusted by changing the mixed ratio of the red phosphor PR, the green phosphor PG and the yellow phosphor PY.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A light source module of a white light emitting diode comprising:
   a blue LED emitting light with a wavelength of 300-500 nm;
   a packaging substrate having a planar top surface thereof, wherein the blue LED is mounted on and electrically connected said planar surface of the packaging substrate;
   a cap layer, enclosing the blue LED, wherein the cap layer includes only one mixture of silicon and phosphor blend at ratio of 1:0.2-0.5; and
   a protective layer covering a top and side surface of the cap layer, wherein the protective layer has an exposed external surface.

2. The light source module of the white light emitting diode of claim 1, wherein the phosphor blend is made of at least one selected from the group consisting of a red phosphor PR, a green phosphor PG and a yellow phosphor PY.

3. The light source module of the white light emitting diode of claim 2, wherein the red phosphor PR is CaS:Eu or SrS:Eu; the yellow phosphor PY is YAG:Ce or TbAG:Ce; and the green phosphor PG is $SrGa_2S_4$:Eu or $Ca8EuMnMg(SiO_4)_4Cl_2$.

4. The light source module of the white light emitting diode of claim 1, wherein a brightener is further added into the cap layer.

5. The light source module of the white light emitting diode of claim 1, wherein the protective layer is made of epoxy resin or silicon.

6. The light source module of the white light emitting diode of claim 1, further comprising: other phosphor material excitable by light with a wavelength of 300-550 nm.

* * * * *